United States Patent
Zhou et al.

(10) Patent No.: US 11,848,570 B1
(45) Date of Patent: Dec. 19, 2023

(54) WIRELESS ACOUSTIC VIABLE ELECTRICITY (WAVE)

(71) Applicant: Technical Systems Integration, Inc., Norfolk, VA (US)

(72) Inventors: Gong Zhou, Norfolk, VA (US); Adrian Hernandez, Norfolk, VA (US); Casey Durr, Norfolk, VA (US)

(73) Assignee: Technical Systems Integration, Inc., Norfolk, VA (US)

( * ) Notice: Subject to any disclaimer, the term of this patent is extended or adjusted under 35 U.S.C. 154(b) by 0 days.

(21) Appl. No.: 17/900,976

(22) Filed: Sep. 1, 2022

Related U.S. Application Data

(60) Provisional application No. 63/394,791, filed on Aug. 3, 2022.

(51) Int. Cl.
*H02J 50/15* (2016.01)
*H02J 50/40* (2016.01)
*H10N 30/30* (2023.01)

(52) U.S. Cl.
CPC ............ *H02J 50/15* (2016.02); *H02J 50/402* (2020.01); *H10N 30/30* (2023.02)

(58) Field of Classification Search
CPC ........ H02J 50/15; H02J 50/402; H01L 41/113
See application file for complete search history.

(56) References Cited

U.S. PATENT DOCUMENTS

| | | | |
|---|---|---|---|
| 6,798,716 B1 | 9/2004 | Charych | |
| 9,627,919 B2 | 4/2017 | Radziemski et al. | |
| 10,992,325 B2 * | 4/2021 | Urzhumov | ........... H04B 1/0458 |
| 2013/0271088 A1 * | 10/2013 | Hwang | ................... H02J 50/15 |
| | | | 320/155 |
| 2015/0333528 A1 * | 11/2015 | Leabman | ................ H02J 50/23 |
| | | | 307/104 |
| 2016/0268813 A1 * | 9/2016 | Reynolds | ............. G10K 11/346 |

\* cited by examiner

*Primary Examiner* — Carlos Amaya
(74) *Attorney, Agent, or Firm* — Maier & Maier, PLLC

(57) ABSTRACT

A Wireless Power Transfer (WPT) system may transfer power, without mechanical contact, underwater between a transmitter device and a receiver device or multiple receiver devices in long ranges (>1 meters). An exemplary embodiment may employ focused acoustic sound wave to transfer wireless power underwater over long distances. An embodiment may include a transmitter and receiving device with onboard electronics that effectively power a target electronic system or battery storage device with minimal power losses during transmission.

8 Claims, 16 Drawing Sheets

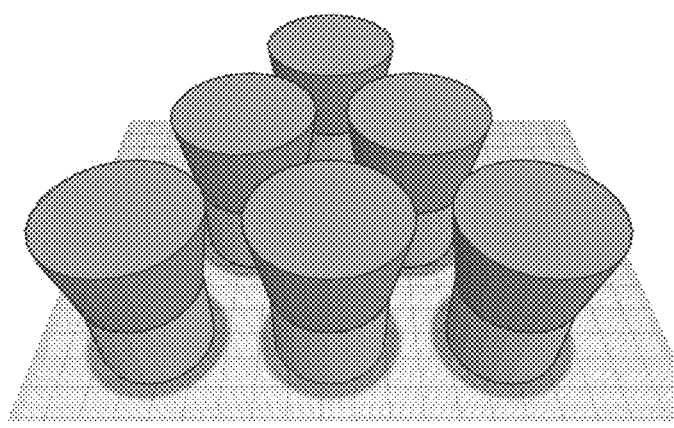 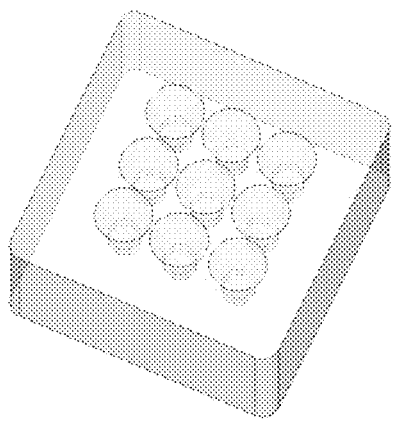
Figure 2A                    Figure 2B

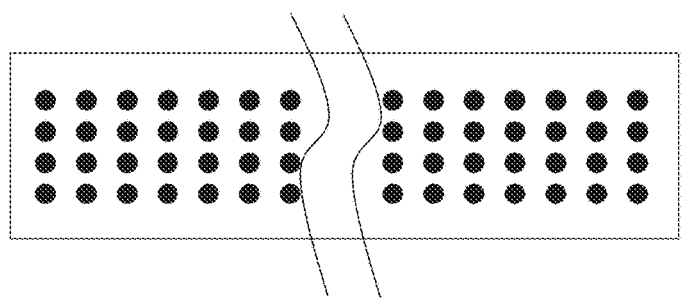
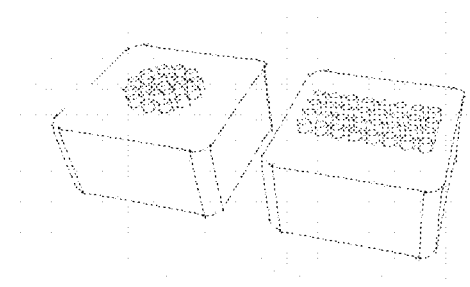
Figure 2C
Figure 2D

WIRELESS ACOUSTIC VIABLE ELECTRICITY (WAVE)

FIELD

An exemplary embodiment relates to the field of wireless power transferring systems.

BACKGROUND

Wireless Power Transfer (WPT) technology is an innovative power distribution approach that allows for great spatial freedom between the power source and the target device. Over the past decade, as technology has progressed, various WPT technologies have been developed but are limited either by their WPT efficiency or range. These technologies include inductive power transfer (IPT), capacitive power transfer (CPT), and optical coupling energy transfer. These WPT technologies have difficulty wirelessly transferring power underwater because they employ electromagnetic (EM) waves for WPT, and the EM properties of water tend to resist their propagation and cause severe attenuation The IPT system, which uses coupled electromagnetic field coils for energy transfer, is widely used in WPT systems. However, the major drawback of this electromagnetic coupling method is the transmission distance is relatively limited, causing the efficiency to decrease rapidly with increasing distance. Additionally, IPT requires precision mating for the transfer of electrical energy and cannot transfer power effectively over a conductive medium.

The CPT system, which transfers power via high frequency resonant power, has been successfully implemented in some miniature devices. However, CPT systems share the same limitation as the IPT system of low efficiency over a long distance.

Optical coupling energy transfer systems operate correspondingly to far-field electromagnetic and microwave energy transfer and offer focusing ability and transfer range in the air but are currently limited by low photovoltaic conversion efficiencies and are sensitive to atmospheric fluctuations as well as diffraction losses in other transfer mediums which result in a low transfer efficiency when operating over long distances.

SUMMARY

According to at least one exemplary embodiment, a method, system, and apparatus for wirelessly transferring power in water over long distances may be shown and described. An exemplary embodiment may transfer power from a power source to receiving objects to power or charge an electronic system or energy storage system on one or more targets with high efficiency. For example, an embodiment may power an onboard electronic system or charge a battery connected to a compact receiver device.

An exemplary embodiment may include a power source with a power controller capable of producing a voltage input to a transmitter device or an array of piezoelectric power transducers. The voltage may be produced as DC or AC power. An embodiment may also include a receiver device which may include multiple piezoelectric power transducers which receive acoustic energy from the transmitter device. The piezoelectric transducers in the receiver may convert the received acoustic energy into electric power which may be DC power. The electric DC power may be stored in an energy storage unit such as a battery or capacitor or may be used to directly power a load connected to the receiver device. An exemplary embodiment may include multiple transmitter devices and/or multiple receiver devices. Multiple receivers may be used to capture energy from one transmitter, or multiple transmitters may be directed towards a single receiver. The wireless power transfer may be through a liquid transmission medium such as water, a solid medium, or a gaseous medium such as the air. The beam may be sent from the transmission array to the receiver transducer array within the receiver device which may power a load or be stored in a storage unit. The receiving controller may determine where the energy received by the array is directed (e.g., whether the energy is directed towards the load or a storage unit).

A transmitter device may be used to convert electrical power from a first power source, such as a battery or a generator, to mechanical energy as acoustic sound waves. For example, the transmitter device may include an array of piezoelectric power transducers to convert the electrical power into sound waves. A controller may regulate the relative phase and amplitude difference of the piezoelectric power transducers to form an acoustic beam shape and directivity. The controller may project the main lobe of the sound wave in a specified direction towards the target device. By adjusting the relative phase and amplitude difference of the output of each piezoelectric transducer in the array, an exemplary controller may focus and steer the generated acoustic sound wave/beam directly towards the target device or receiver.

The target device may be a receiver or multiple receiver devices configured to convert the mechanical energy from the acoustic sound waves/beam into electrical energy. The controller (or an additional controller) may be used to manage the transferred electrical energy to power a load or charge an energy storage unit connected to the receiver device.

BRIEF DESCRIPTION OF THE FIGURES

Advantages of embodiments of the present invention will be apparent from the following detailed description of the exemplary embodiments thereof, which description should be considered in conjunction with the accompanying drawings in which like numerals indicate like elements, in which:

FIG. 2A is an exemplary embodiment of an array of power transducers.

FIG. 2B is an exemplary embodiment of an array of power transducers.

FIG. 2C is an exemplary embodiment of an array of power transducers.

FIG. 2D is an exemplary embodiment of an array of power transducers.

DETAILED DESCRIPTION

Figure 1:
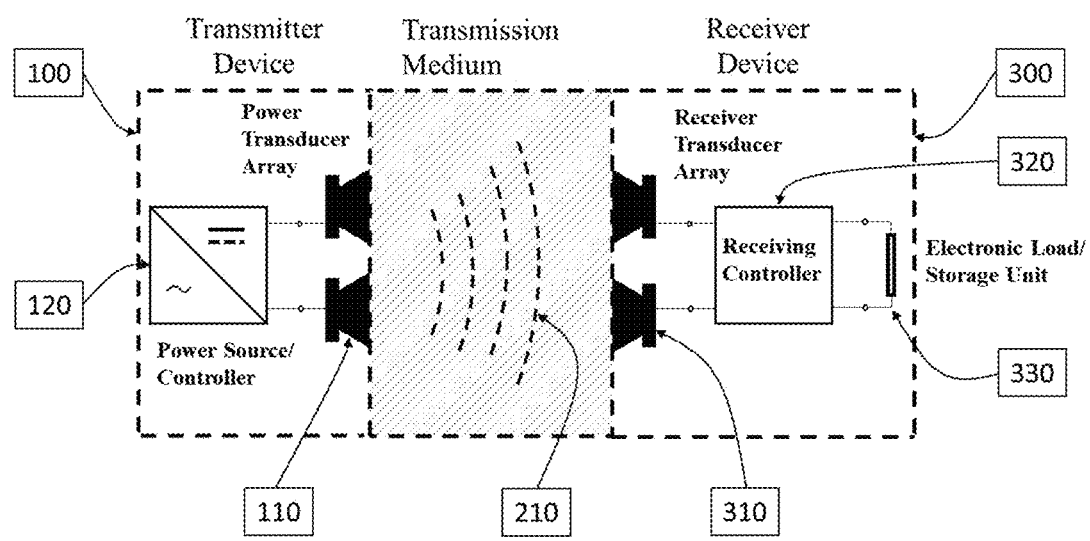
FIG. 1 is an exemplary embodiment of a wireless power transfer system.

Aspects of the invention are disclosed in the following description and related drawings directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

As used herein, the word "exemplary" means "serving as an example, instance or illustration." The embodiments described herein are not limiting, but rather are exemplary only. It should be understood that the described embodiments are not necessarily to be construed as preferred or advantageous over other embodiments. Moreover, the terms "embodiments of the invention," "embodiments," or "invention" do not require that all embodiments of the invention include the discussed feature, advantage, or mode of operation.

Further, many of the embodiments described herein are described in terms of sequences of actions to be performed by, for example, elements of a computing device. It should be recognized by those skilled in the art that the various sequences of actions described herein can be performed by specific circuits (e.g., application specific integrated circuits (ASICs)) and/or by program instructions executed by at least one processor. Additionally, the sequence of actions described herein can be embodied entirely within any form of computer-readable storage medium such that execution of the sequence of actions enables the at least one processor to perform the functionality described herein. Furthermore, the sequence of actions described herein can be embodied in a combination of hardware and software. Thus, the various aspects of the present invention may be embodied in a number of different forms, all of which have been contemplated to be within the scope of the claimed subject matter. In addition, for each of the embodiments described herein, the corresponding form of any such embodiment may be described herein as, for example, "a computer configured to" perform the described action.

The features and principles of the present invention are described in detail below, with reference to the indicated figures. The embodiments of the invention are presented as examples of the invention and should not be understood as limitations of the invention. Although the illustrated embodiments depict triangular or pyramidal configurations of the transmitter array, a person skilled in the art may readily see that various transmitter array designs and configurations may be employed to achieve the required acoustic beamforming and beam steering process while maximizing the focusing and beam directivity. Similar various receiver array designs may be employed to maximize the capture of mechanical energy from the acoustic wave to be converted to electrical energy. Similarly, various transmitter and receiver array designs may also be altered to maximize underwater WPT transfer over long distances.

Referring now to FIG. 1, FIG. 1 may illustrate an exemplary embodiment of a wireless power transfer system. A transmitter device 100 may be configured to transmit acoustic sound waves across a transmission medium, such as water. The transmitter device 100 may include a power source with a transmission controller 120 as well as a power transducer array 110 which may include multiple piezoelectric power transducers. The transmitter device 100 may be capable of focusing and steering the acoustic beam. The transmission controller 120 may be configured to alter the phase and amplitude of the output signals of the transmitter array for the focusing and steering.

Beamforming and beam steering techniques may be implemented. When several acoustic emitters interact together, they may have constructive or destructive interference depending on the direction where the total pressure at a given point is equal to the sum of all the localized component pressures. The overarching envelope connecting each source's wavefronts represents the overall pressure wavefront, an acoustic analog to Huygens' Principle on the wavefronts of light. By controlling the relative phase and amplitude difference between the emitters, the acoustic beam shape and directivity can be shaped. For example, the transmitter device 100 may control each piezoelectric power transducer in the array 110 to individually adjust the relative phase and amplitude of each transducer. A controller 120 within the transmitter device 100 may identify and implement relative phases and amplitudes for each transducer to optimize constructive and destructive interference such that the acoustic waves of each transducer are combined into a single acoustic beam. Phase may be controlled by a program configured to send signals through the microcontroller 120 to each transmitter in any desired sequence. The amplitude of the signal may be dependent of the voltage applied, and the microcontroller and associated program may alter the applied voltage. The beam 210 can thus be steered and focused by adjusting phase and amplitude of each transducer, as well as the spacing and firing sequence of the group of transmitters. Other factors that may alter the focus or direction of the beam may include the spacing between each transmitter, the relative angles of the transmitters, and the power ratings of the transmitters.

While a typical transducer transmitting a signal over a long range may suffer large energy losses due to the geometric spreading of the generated signal, an exemplary embodiment may implement a group of transducers which can each transmit an acoustic signal with a focused acoustic beam or a small beam angle in order to counter the spreading loss. The focused acoustic beam may be formed from the microcontroller by setting a desired phase and amplitude of the transmitters in the array in order to take advantage of constructive and destructive interference to bolster the conical region where the signals from each transmitter meet.

Still referring to the exemplary embodiment illustrated in FIG. 1, the beam 210 may be directed towards a receiver device 300. The receiver device 300 may include a receiver transducer array 310, a reception controller 320 and an electronic load or storage unit 330. The reception controller 320 may be configured to route the power received by the receiver device 300. For example, controller 320 may transfer the energy received on the receiver array 310 to an energy storage system or load 330. In addition to altering the phase and amplitude of the transmitters to steer or direct the beam, an exemplary embodiment may include one or more motors for positioning the transmitters and/or the receivers. For example, the transmitter array may be arranged on a platform that can be angled by actuating a motor, and a receiver array can be selected and aimed at using the motors. Thus, steering of the beam may be accomplished by physically moving the transmitter array and by altering the phase and amplitude of the transmitters. An exemplary embodiment may implement maximum power point tracking to identify an angle at which the power transfer between a transmitter and a receiver is at a maximum point, and may retain that angle until a new maximum power point is identified.

Due to the nature of the spreading phenomenon of acoustic waves, a single piezoelectric power transducer cannot produce a directional, focused ultrasonic wave beam. An array of piezoelectric power transducers may be used by an exemplary embodiment to focus and direct the acoustic beam designed based on the pattern multiplication theorem of specific spacing between piezoelectric power transducers. FIG. 2A shows a simple 6 transducer power array that can be used to focus and steer the acoustic bean wave. An array may include a larger number of piezoelectric power transducers to increase the transmitter power output, which increases the mechanical energy output of the projected acoustic beam.

FIGS. 2A-2D illustrate various possible array configurations. The illustrated arrays may be arranged as the transmitter array 110 and/or the receiver array 310. FIG. 2A illustrates an array of 6 transducers arranged as a triangle. FIG. 2B illustrates an array of 9 transducers arranged as a square or diamond. FIG. 2C illustrates an array of multiple transducers along the length of an array. FIG. 2D illustrates a 3-dimensional drawing of an array arranged as a circle and another array arranged as a rectangle. Any potential array configuration may be used.

Figure 3:
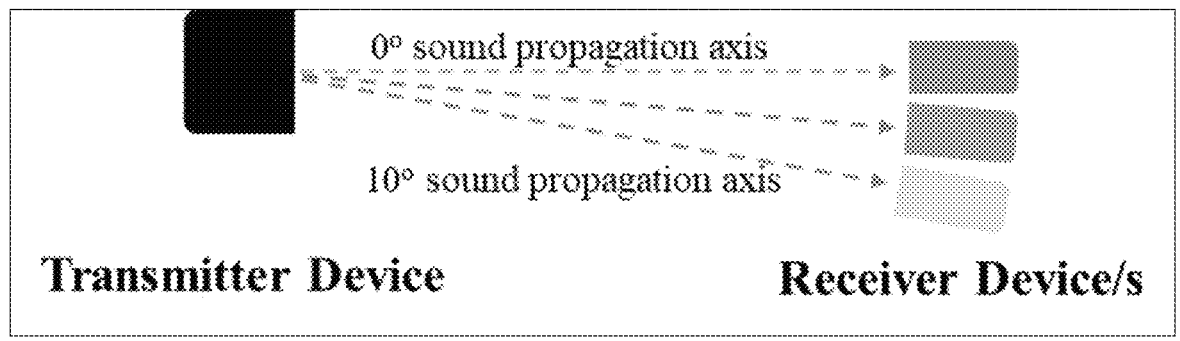
FIG. 3 is an exemplary schematic illustrating the steering of an acoustic beam at various propagation axes.

An exemplary power transducer array may produce a focused acoustic beam and may steer the beam towards the receiver device position through water over a long distance. FIG. 3 illustrates an exemplary transmitter device projecting the acoustic beam at different angles so the acoustic beam can be steered towards a moving receiver device to maintain the WPT link or to steer to multiple receivers at different locations without moving the transmitter array relative position.

A receiver array of the piezoelectric transducers may be used to convert the mechanical energy from the acoustic beam to electrical energy. A power controller connected to the receiver array may be used to control the electrical energy produced from each piezoelectric transducers and may convert the energy into direct current (DC) power using harvesting interface circuits.

For WPT from one transmitter device to one receiver device, an exemplary transmitter device may convert the electrical energy from the power source to acoustic beam wave. The receiver array with the receiver device may convert the mechanical energy from the acoustic beam to useful electrical energy. The power controller may maximize the DC power output to the energy storage unit and/or to power a load or electronics directly on the system where the receiver device is installed. In an exemplary embodiment, a transmitter device may be placed on a ship or submarine and/or may be installed underwater. A receiver device may be installed on another ship, submarine, unmanned underwater vehicle, battery storage device, or any other contemplated system. For example, a transmitter array may be arranged at the bottom of a surface ship and may extend across any distance along the bottom of the ship. The receiver array may be of a different shape and/or size than the transmitter array.

An exemplary piezoelectric transducer may be formed from a composite such as barium titanate ($BaTiO_3$), lead zirconate titanate (PZT), and polyvinylidene fluoride (PVDF). The material may be chosen based on a desired resonance frequency or based on other factors. Stress applied to the piezoelectric material in the form of a sound wave or beam may induce a polarization, and an applied electric field may induce a strain. For example, a transducer may convert electric power ($W_E$) to acoustically radiated power ($W_A$) with a degree of efficiency (E) as: $W_E = \epsilon W_A$. The efficiency may be a value between 0 and 1, and may be in the range between 0.4 and 0.8 in some embodiments.

The attenuation of acoustic waves may be relatively low in the water allowing the underwater environment to be more transparent to sound energy. The ocean may act as a low-pass filter for ambient noise, and the underwater systems may operate at lower frequencies. For example, for a frequency of 10 kHz, sound travels in seawater about 10 km before amplitude is reduced significantly because of absorption; when the frequency is increased to 1 MHz, this distance reduces to about 30 m. Although traveling further, low-frequency acoustic signals may lower the energy transfer rate for Underwater WPT applications. Furthermore, low input frequency waves may present a challenge to optimize piezoelectric energy receivers' energy output due to the relatively high elastic moduli of piezoelectric materials. The efficiency and power density of piezoelectric vibrational energy converters are strongly frequency-dependent because the piezoelectric material generates maximum power at its resonance frequency. The system may have a weaker power output when excited at frequencies away from the resonant frequency. If piezoelectric ceramics are used as the energy conversion element, the lowest resonance frequency mode may be in the kilohertz range or higher.

Acoustic propagation may experience attenuation due to spreading and absorption. Spreading loss is due to the expanding area that the sound signal encompasses as it geometrically spreads outward from the source. The absorption loss represents the energy loss in the form of heat due to viscous friction and ionic relaxation that occurs as the wave generated by an acoustic signal propagates outwards and varies linearly with range.

$$\text{Absorption loss} = 10 \, Log \, (\alpha(f)) * R(dB)$$

Where R=range in kilometers and $\alpha(f)$=absorption coefficient.

An exemplary embodiment may include multiple transmitter devices and/or multiple receiver devices. For WPT from one transmitter device to multiple receiver devices, the transmitter device may convert the electrical energy from the power source to an acoustic beam wave. Multiple receiver devices may be positioned within the acoustic beam path to capture the mechanical energy and convert it to electrical energy as described above.

Figure 4:
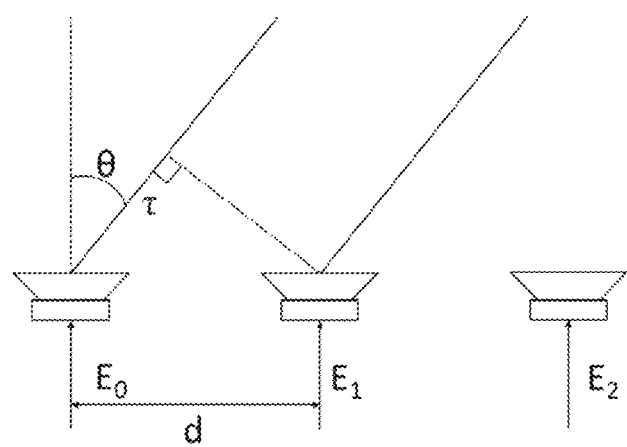
FIG. 4 is an exemplary embodiment of an array of power transducers.

Referring now to FIG. 4, FIG. 4 may illustrate an exemplary emitter array system. Each emitter may have an output acoustic signal defined by:

$$E_n = a_n \sin(\omega t + n\psi),$$

where ω=angular speed, a=amplitude factor, Ψ=phase difference between successive emitter due to an additional travel distance τ caused by the angle of the listener (θ) and a phase offset ϕ that added to change the beam steering angle. The exemplary embodiment in FIG. 4 illustrates the use of three emitters, $E_0$, $E_1$, and $E_2$, which may be spaced apart by a predetermined spacing distance d, although more or less emitters may be contemplated.

Mathematically, Ψ can be expressed as:

$$\psi = \frac{2\pi}{\lambda}\tau + \varphi = \frac{2\pi}{\lambda}d\sin\theta + \varphi,$$

where λ=wavelength. The acoustic beam diagram may be computed for the sum of the emitter array as:

$$E = \sum_{n=0}^{N-1} E_n = a_0\sin(\omega) + \cdots + a_{N-1}\sin(\omega t + (N-1)\psi)$$

With a constant amplitude of a(n)=1 and no phase offset phase offset (ϕ=0), the normalized magnitude of this sum is:

$$|E| = \left|\frac{\sin\left(\frac{N\pi d\sin\theta}{\lambda}\right)}{N\sin\left(\frac{\pi d\sin\theta}{\lambda}\right)}\right|$$

Directivity may increase as N increases (and thus there is less spread with the increase in emitter sources).

As previously described, the relative phase difference between piezoelectric elements can be used to steer the beam so that the main lobe can be steered to an angle different than 0 degrees (such as, for example, within a range between −90 and 90 degrees) by adding a phase offset ϕ as:

$$\varphi = \frac{2\pi}{\gamma}d\sin(\alpha), \text{ For } \alpha \in \left[-\frac{\pi}{2}; \frac{\pi}{2}\right]$$

Figure 5:
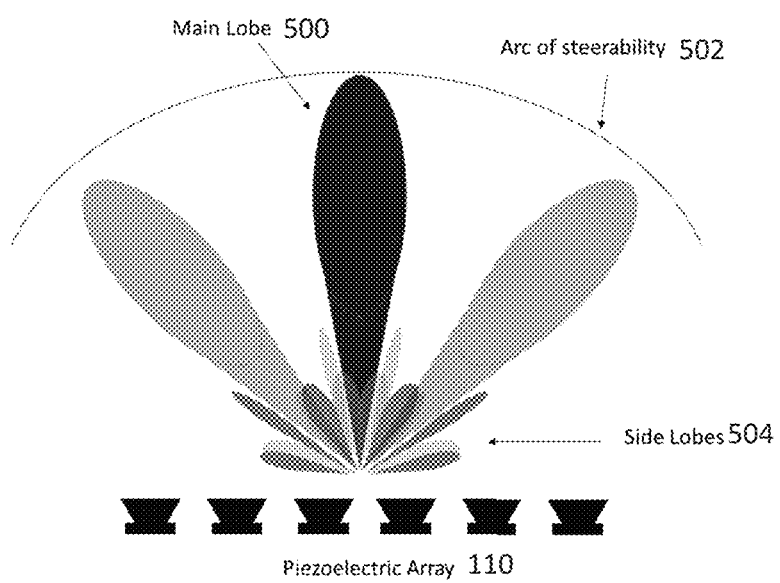
FIG. 5 is an exemplary schematic illustrating the steering of multiple acoustic beams at various angles.

As shown in FIG. 5, using the piezoelectric transmission array 110, the main lobe 500 may be steerable along an arc of steerability 502 which may extend from −90 degrees to 90 degrees, for example. The sidelobes 504 may also be steered and/or offset accordingly.

An exemplary embodiment may provide several benefits ranging from the ease of operation and reducing maintenance effort/cost to enhancing operational flexibility and capability such as providing the capability to deliver power to contested waters and other potential underwater applications.

Figure 6A:
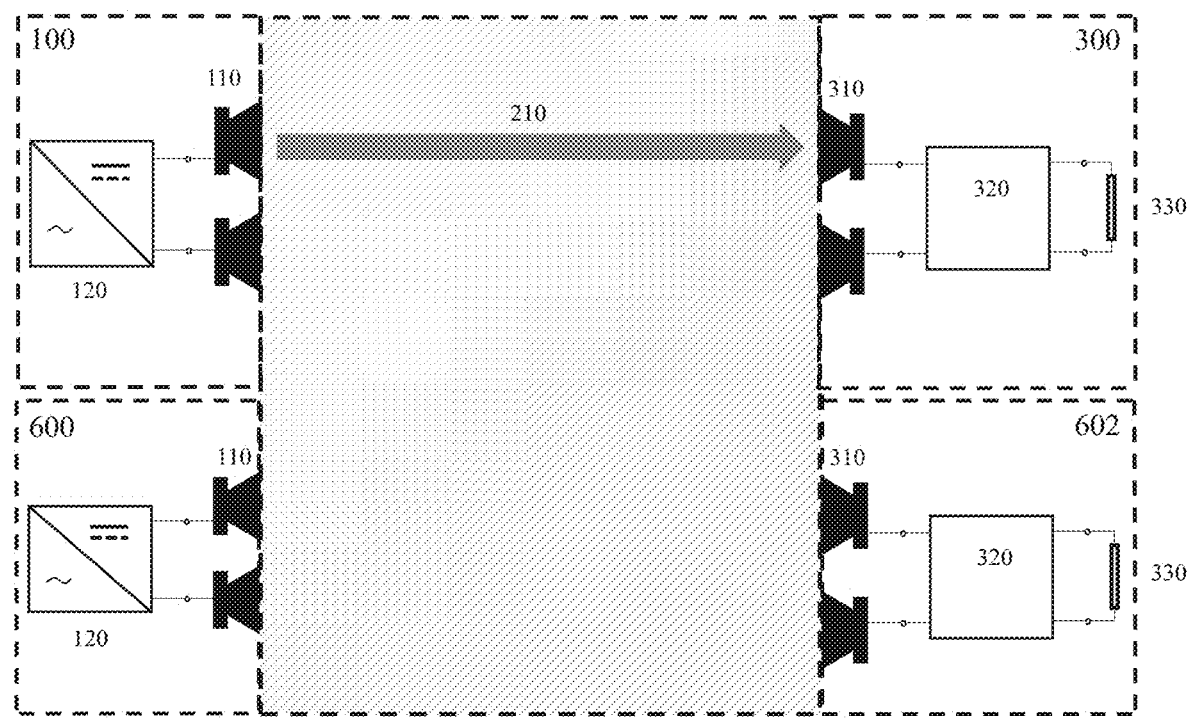
FIG. 6A is an exemplary embodiment of a wireless power transfer system.

Multiple transmitters and/or emitters may be implemented in an exemplary embodiment. FIG. 6A illustrates an exemplary embodiment with a first transmitter 100, first receiver 300, second transmitter 600, and second receiver 602. Each transmitter 100/600 and each receiver 300/602 may include a piezoelectric transducer array 110/310 and appropriate controllers. It may be contemplated that a group of transmitters or a group of receivers is controlled by a single transmission or reception controller, or each transmitter and each receiver may be fitted with an independent controller.

Figure 6B:
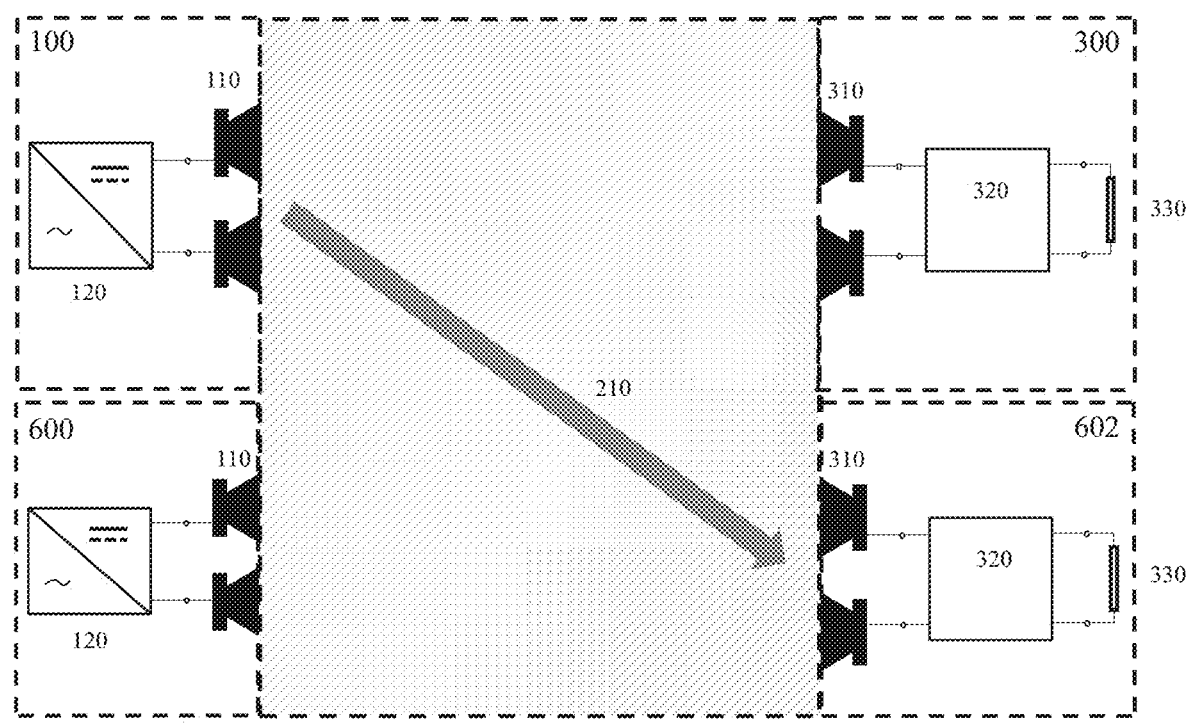
FIG. 6B is an exemplary embodiment of a wireless power transfer system.
Figure 6C:
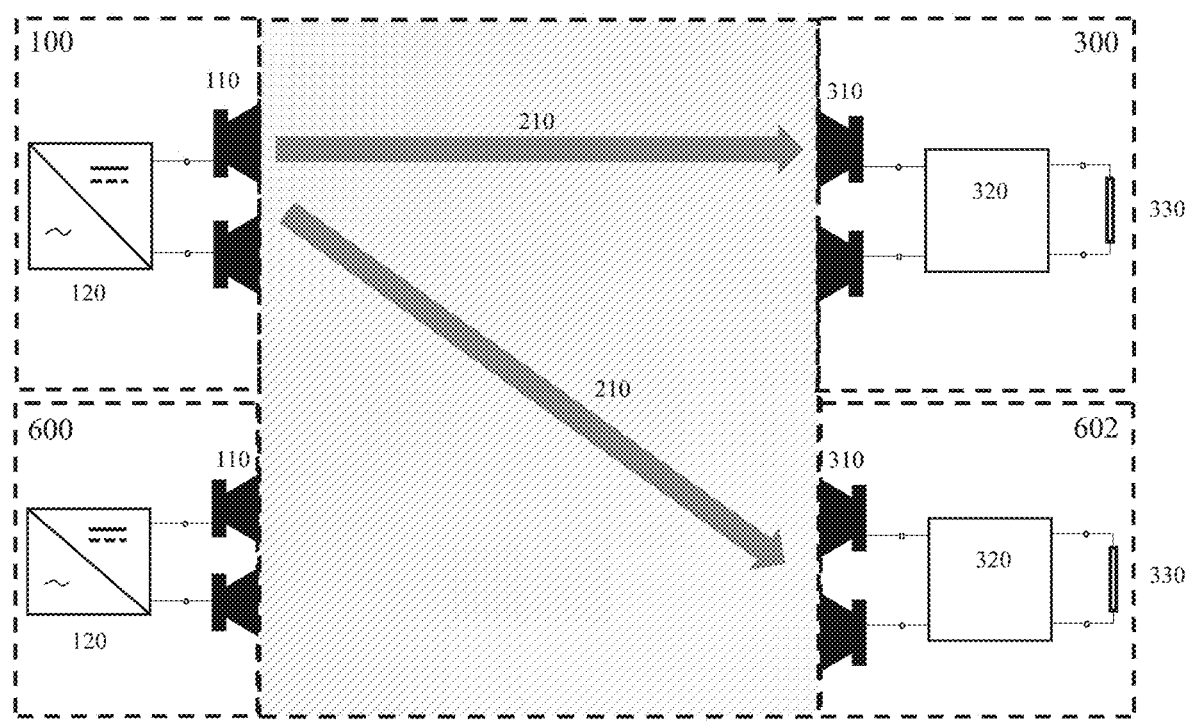
FIG. 6C is an exemplary embodiment of a wireless power transfer system.
Figure 6D:
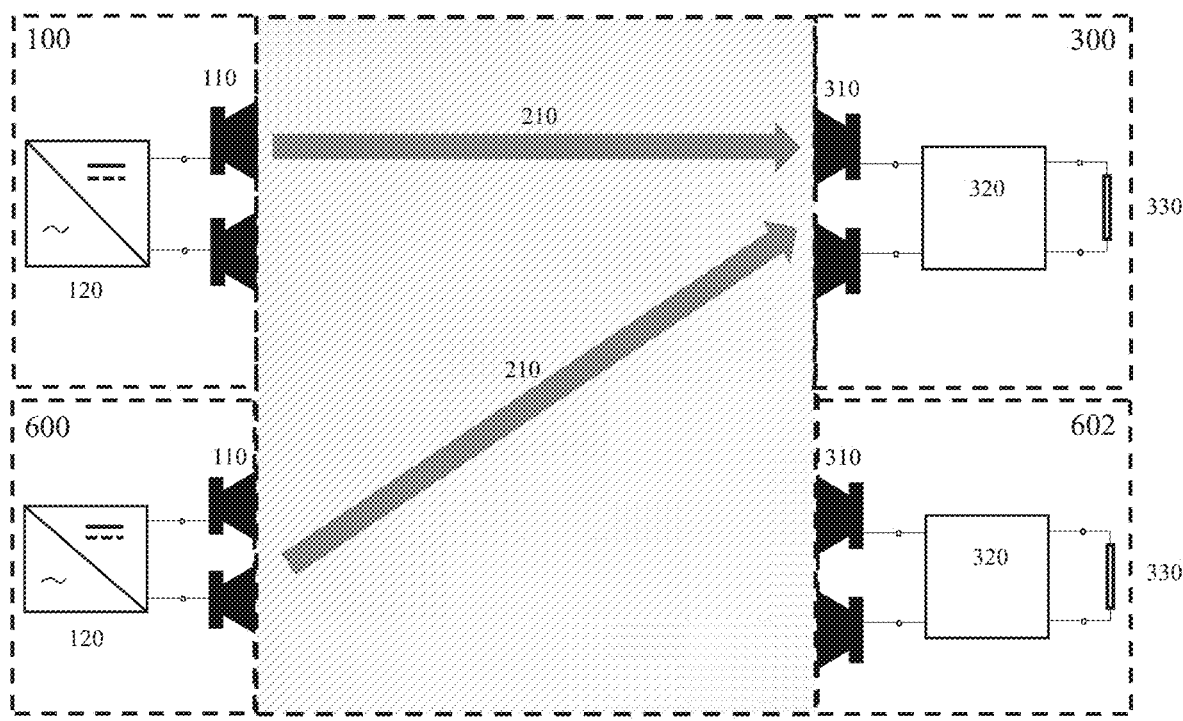
FIG. 6D is an exemplary embodiment of a wireless power transfer system.
Figure 6E:
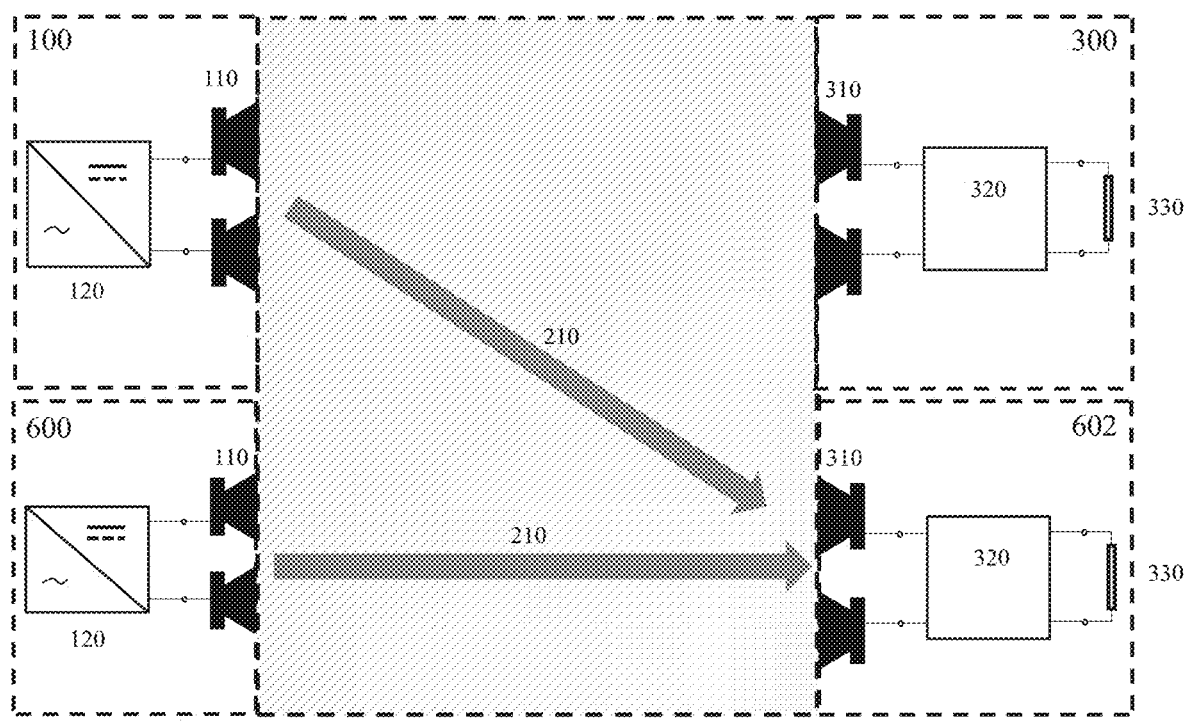
FIG. 6E is an exemplary embodiment of a wireless power transfer system.
Figure 6F:
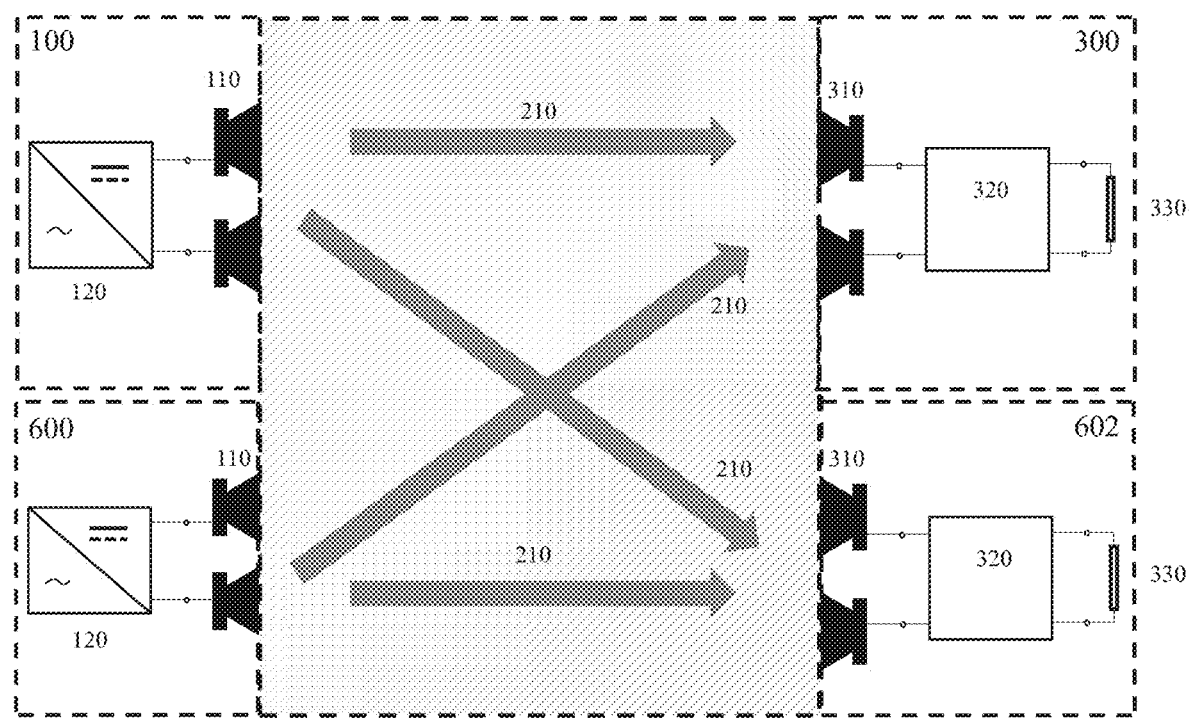
FIG. 6F is an exemplary embodiment of a wireless power transfer system.

As shown in the exemplary embodiment illustrated in FIG. 6A, a first transmitter 100 may project a beam 210 to the first receiver 300. FIG. 6B may illustrate a first transmitter 100 configured to select and direct the beam 210 towards the second receiver 602. An exemplary transmitter may direct multiple beams towards multiple receivers, as shown in FIG. 6C. FIG. 6C illustrates a first transmitter 100 configured to direct multiple beams 210 towards the first receiver 300 and the second receiver 602. Similarly, a receiver may receive beams 210 from multiple transmitters 100 and 600. As shown in FIG. 6D, the receiver 300 receives energy from beams 210 originating from both the first transmitter 100 and the second transmitter 600. FIG. 6E illustrates a first transmitter 100 and second transmitter 600 configured to each direct a beam 210 towards the second receiver 602. FIG. 6F illustrates an exemplary embodiment where the first transmitter 100 and second transmitter 600 are configured to emit multiple beams each, such that each transmitter transmits a beam to both the first receiver 300 and the second receiver 602.

Figure 7:
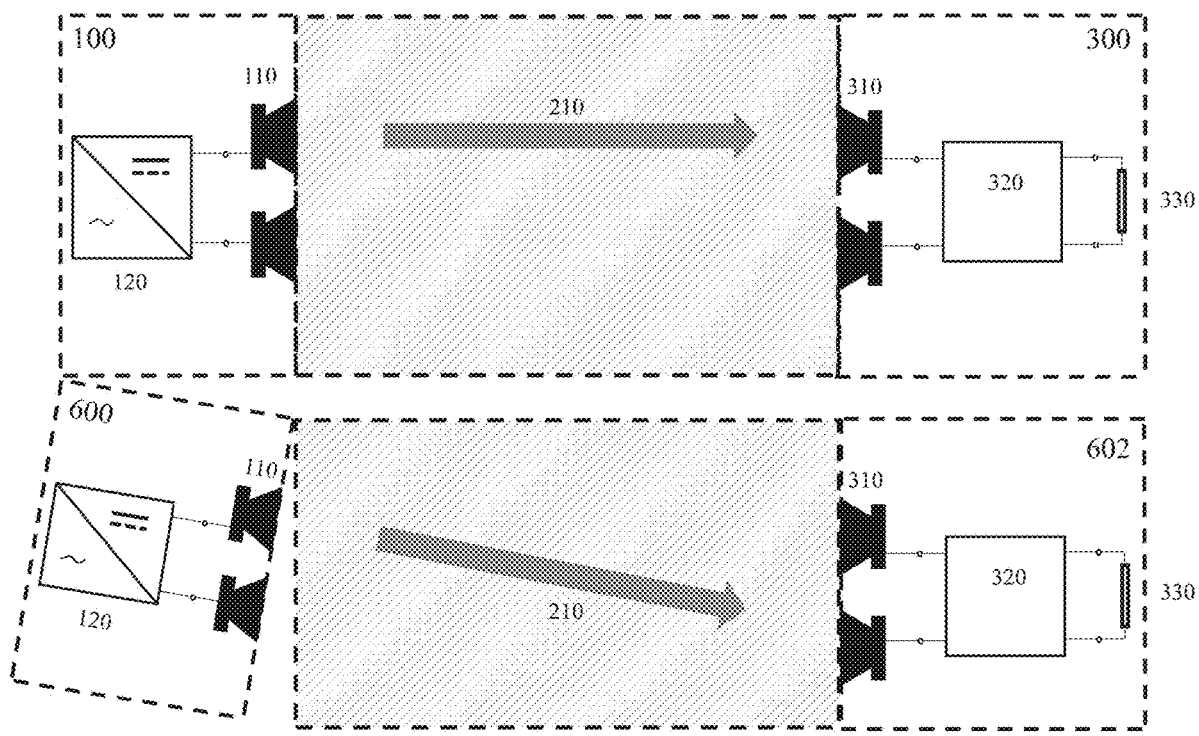
FIG. 7 is an exemplary embodiment of a wireless power transfer system.

An exemplary embodiment may include multiple transmitters and receivers, and each transmitter may be configured to emit a beam towards any and all receivers. The beam may be directed towards the receivers by adjusting the amplitude and phase offset at the transmitter. Further, it may be contemplated that the sound propagation axis and thus the beam may be directed by adjusting the angle of the transmitter device in relation to the sound propagation axis. For example, as shown in FIG. 7, the transmitter 600 may be angled towards the receiver 602 to direct the beam into the receiver transducer array. In an exemplary embodiment, motors may be placed on the transmitter device 100/600 in order to allow for movement of the face of the device and thus an adjustment of the sound propagation angle and beam. For example, a power controller may operate the motors connected to the transmitter 600 to turn the transmitter 600 to better face one or more receivers. An exemplary embodiment may implement maximum power point tracking in order to determine an optimal angle for power transmission based on the configuration of the transmitters/receivers and any obstacles. The motors may be controlled automatically/autonomously to direct the transmitters and/or receivers at an optimal angle, or may be user-controlled.

Figure 8:
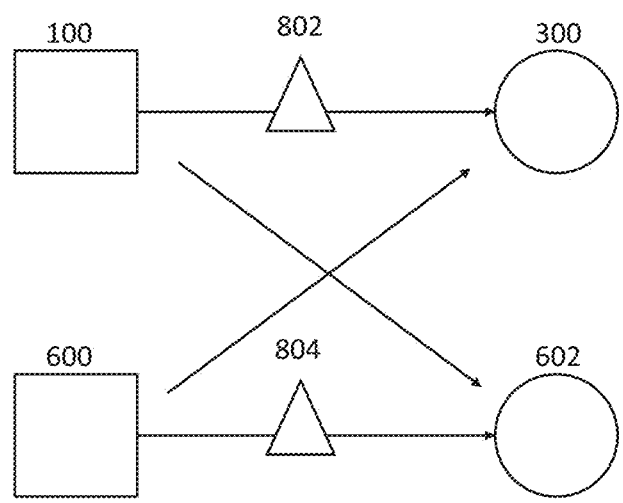
FIG. 8 is an exemplary embodiment of a wireless power transfer system with obstacles.

As shown in the exemplary embodiment in FIG. 8, an exemplary transmitter 100/600 may be blocked from one or more receivers 300/602 by objects/obstacles 802/804. In such a situation, the blocked transmitter may select a different receiver to transmit power to. It may be contemplated that a block or object 802/804 is detected and transmission towards the blocked receiver may be canceled. Instead, an exemplary transmitter may transmit to one or more additional/unblocked receivers. In some embodiments, the transmitter may detect that a receiver is blocked, search for additional possible receivers, alter the amplitude and phase offset to direct the beam to the additional possible receivers, and redirect the transmission of the signal to the additional possible receivers. Alternatively, the transmitter may be transmitting to all possible receivers within range, and so upon detecting an obstruction an exemplary embodiment may simply stop transmitting to the obstructed receiver and continue transmitting to the other receivers.

Figure 9:
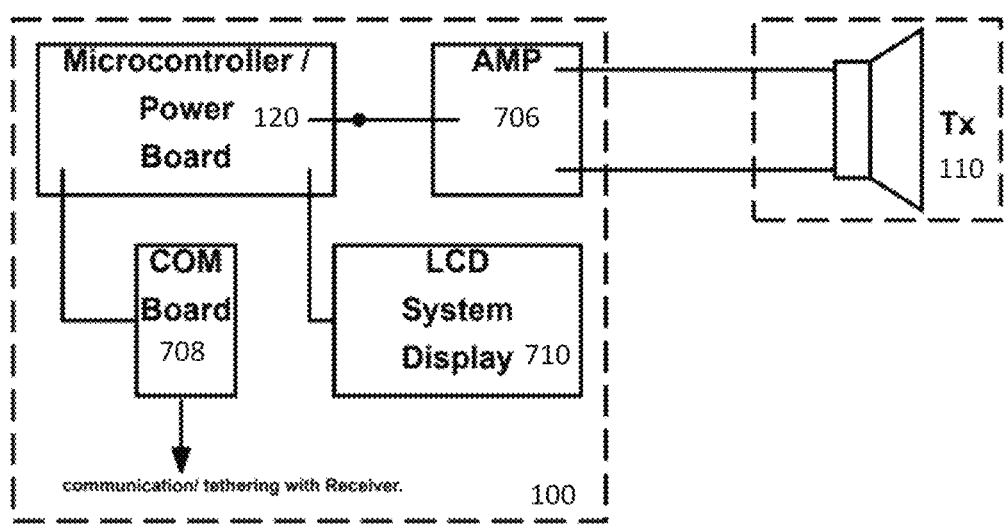
FIG. 9 is an exemplary block diagram of a transmitter device.

FIG. 9 may illustrate a functional block diagram for an exemplary transmitter device 100. An exemplary embodiment may include a microcontroller/power board 120 which may monitor and direct energy to the transmitter array/system 110 through an amplifier 706. A communication board 708 may also be included for allowing connections to wireless systems. For example, the communication board 708 may communicate with one or more receivers. The transmitter 100 may communicate a pulse-echo or ping to the receiver, which may reply with a ping, in order to allow the transmitter and/or user to identify whether the two units are aligned and transferring power, without the need for eyes-on target or communication between multiple users. An exemplary embodiment may also include a system display 710 for displaying errors and information to a local user. For example, the system display 710 may be a liquid crystal display (LCD). Voltage, transmitter power output, receiver power reception, program/system status, program selection, and/or coupling status between transmitter and receiver may be displayed or indicated on the display 710. A program selection may be an identification of a program for the transmitter and/or receiver to execute. For example, a program selection may be for a narrow beam or a wide beam, or may target specific receivers.

Figure 10:
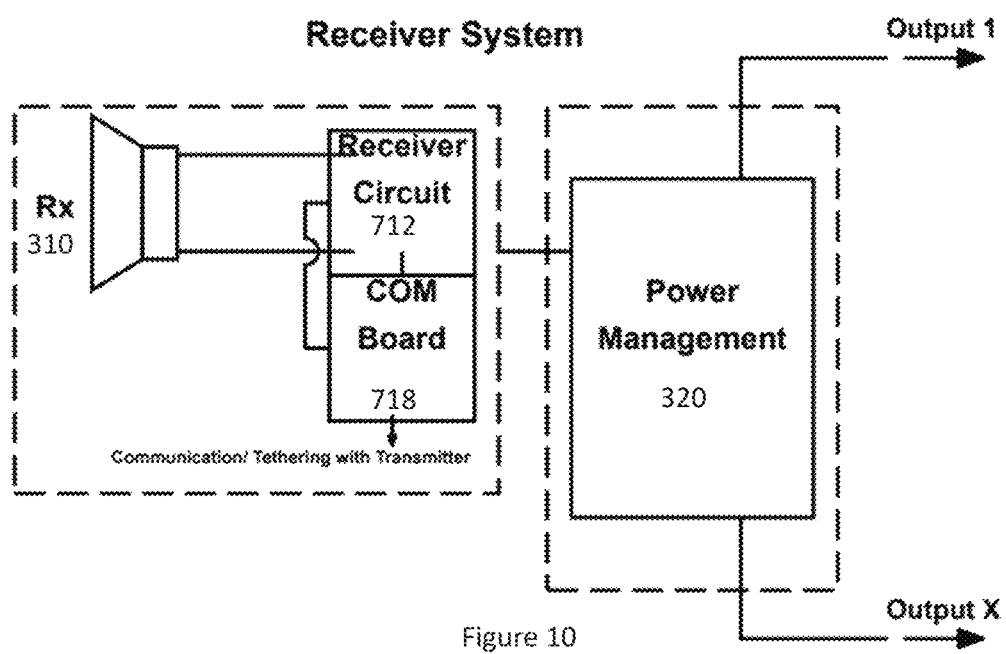
FIG. 10 is an exemplary block diagram of a receiver device.

FIG. 10 may illustrate a functional block diagram for an exemplary receiver device 300. The receiver device 300 may direct power received by the receiver array 310 through a receiver circuit 712 (which may be controlled by a communications board 718 in communication with the communication board 708 of the transmitter 100). The power may be directed to a power management unit 320 which may select an output for the power, such as an energy storage system or a load.

Maximum energy flux of an exemplary embodiment for underwater application may be estimated based on the cavitation threshold of the acoustic signal, at which signal can have enough power to allow bubbles/cavities to form in the evacuated negative pressure regions, which may cause a transducer's performance to degrade in linearity and radiation efficiency. The cavitation pressure threshold may determine the onset of cavitation and may be estimated by the following equation, where Lc is the cavitation threshold in dB re 1 µPa, z is the depth in meters, and f is the frequency measured in kHz:

$$Lc = 20 \log\left[1 + \left(\frac{z}{10}\right) + \left(\frac{f}{36}\right)^2\right] + 220$$

The foregoing description and accompanying figures illustrate the principles, preferred embodiments, and modes of operation of the invention. However, the invention should not be construed as being limited to the particular embodiments discussed above. Additional variations of the embodiments discussed above will be appreciated by those skilled in the art (for example, features associated with certain configurations of the invention may instead be associated with any other configurations of the invention, as desired).

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. A method for wirelessly transmitting power, comprising:
    activating a transmitter array comprising a first plurality of piezoelectric transducers arranged in a first array using a transmission controller;
    activating a secondary transmitter array comprising a second plurality of piezoelectric transducers using the transmission controller;
    transmitting a signal from each of the piezoelectric transducers through a transmission medium towards a third array of piezoelectric transducers;
    altering a relative phase and an amplitude of one or more piezoelectric transducers from the first array and one or more piezoelectric transducers from the second transmitter array to direct a beam produced by a combination of the signals from each of the piezoelectric transducers of the first array and the second transmitter array directly to the third array of piezoelectric transducers and focusing at least one additional beam within the signals and altering the relative phase and amplitude of the signals such that a portion of the signals produced by each of the first array and second transmitter array of transducers overlapping the beams are concentrated by aligning constructive interference of more than one of the piezoelectric transducers from the first array and second transmitter array and such that a portion of the signals not overlapping or interfering with the beams are attenuated using destructive interference, and wherein the at least one additional beam is simultaneously directed at a fourth array of transducers; and
    converting the signals produced by the first and second arrays into electrical energy using the third and fourth arrays of piezoelectric transducers.

2. The method of claim 1, wherein the transmission medium is water.

3. The method of claim 1, wherein a distance between the first array and the third or fourth array is greater than 25 meters.

4. The method of claim 1, further comprising:
    activating, using the transmission controller, one or more additional arrays of piezoelectric transducers, each of the additional arrays further comprising additional piezoelectric transducers for transmitting signals through the transmission medium.

5. The method of claim 1, wherein the signal is transmitted through the transmission medium to a one or more additional arrays of piezoelectric transducers in addition to the third array.

6. A system for wirelessly transmitting power, comprising:
    a first transmitter comprising a first plurality of piezoelectric transducers;
    a second transmitter comprising a second plurality of piezoelectric transducers;
    a transmission controller configured to activate and adjust the first and second transmitter to transmit at least one signal;
    a first receiver comprising a third plurality of piezoelectric transducers and a second receiver comprising a fourth plurality of piezoelectric transducers, and a reception controller, the receivers configured to convert acoustic energy into electrical energy using the transducers and reception controller; and
    a transmission medium separating the receiver from the transmitter;
    wherein the first plurality of piezoelectric transducers are installed in the transmitter as a transmission array and a relative phase and amplitude of the signals produced by the first plurality of piezoelectric transducers and a relative phase and amplitude of the signals produced by the second plurality of piezoelectric transducers are controlled by the transmission controller, and
    wherein the transmission controller is configured to alter the relative phase and amplitude of one or more of the transducers from the first plurality of transducers in conjunction with transducers from the second plurality of transducers to direct the signals produced by the first transmitter and the second transmitter into a beam directed at the third array of piezoelectric transducers, and focus at least one additional beam within the signals by altering the relative phase and amplitude of the signals such that a portion of the signals produced by each of the transducers overlapping the beams are concentrated by aligning constructive interference of more than one of the piezoelectric transducers from the first array and such that a portion of the signals not overlapping or interfering with the beams are attenuated using destructive interference, and wherein the at least one additional beam is directed at the fourth array of transducers wherein the beam and the at least one additional beam are directed at the third and fourth arrays of transducers simultaneously.

7. The method of claim 1, wherein a distance between the first array and the third array is less than one meter.

8. The method of claim 1, wherein a distance between the first array and the third-array is greater than 100 meters.

* * * * *